United States Patent
Ji et al.

(10) Patent No.: US 9,431,402 B2
(45) Date of Patent: Aug. 30, 2016

(54) SEMICONDUCTOR DEVICE HAVING BURIED BIT LINE AND METHOD FOR FABRICATING THE SAME

(75) Inventors: Yun-Hyuck Ji, Gyeonggi-do (KR); Kwan-Woo Do, Gyeonggi-do (KR); Beom-Yong Kim, Gyeonggi-do (KR); Seung-Mi Lee, Gyeonggi-do (KR); Woo-Young Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 187 days.

(21) Appl. No.: 13/468,091

(22) Filed: May 10, 2012

(65) Prior Publication Data
US 2013/0161710 A1    Jun. 27, 2013

(30) Foreign Application Priority Data
Dec. 27, 2011  (KR) .................. 10-2011-0143684

(51) Int. Cl.
| H01L 21/336 | (2006.01) |
| H01L 27/108 | (2006.01) |
| H01L 21/20  | (2006.01) |
| H01L 29/78  | (2006.01) |
| H01L 29/66  | (2006.01) |

(52) U.S. Cl.
CPC ..... *H01L 27/10808* (2013.01); *H01L 21/2018* (2013.01); *H01L 27/10873* (2013.01); *H01L 27/10885* (2013.01); *H01L 29/66666* (2013.01); *H01L 29/7827* (2013.01)

(58) Field of Classification Search
CPC ................ H01L 21/2018; H01L 29/7827
USPC ............ 438/239, 268; 257/296, 329, E29.17
See application file for complete search history.

(56) References Cited

U.S. PATENT DOCUMENTS

| 6,995,957 | B2 | 2/2006 | Jayasekara |
| 7,736,969 | B2 | 6/2010 | Abbott et al. |
| 2004/0214379 | A1 | 10/2004 | Lee et al. |
| 2006/0154453 | A1* | 7/2006 | Son ........................ C30B 25/04 438/482 |
| 2007/0026578 | A1 | 2/2007 | Kim et al. |
| 2007/0032074 | A1 | 2/2007 | Kwak et al. |
| 2009/0250732 | A1* | 10/2009 | Kim ................ H01L 21/31144 257/288 |
| 2010/0090263 | A1 | 4/2010 | Kunkel et al. |
| 2010/0124812 | A1* | 5/2010 | Jung ................. H01L 27/10885 438/429 |
| 2010/0197121 | A1 | 8/2010 | Kim et al. |
| 2011/0101445 | A1 | 5/2011 | Kim et al. |
| 2011/0300684 | A1* | 12/2011 | Choi .................. H01L 27/2409 438/382 |
| 2012/0168854 | A1* | 7/2012 | Jang .................. H01L 27/10876 257/329 |

FOREIGN PATENT DOCUMENTS

| KR | 10-2001-0112829 | 12/2001 |
| KR | 10-0673012 | 1/2007 |
| KR | 10-2007-0047069 | 5/2007 |

(Continued)

*Primary Examiner* — Jamie C Niesz
(74) *Attorney, Agent, or Firm* — IP & T Group LLP (57) ABSTRACT

A method for fabricating a semiconductor device includes: forming an insulation layer over a semiconductor substrate; forming a first conductive layer over the insulation layer; forming a plurality of buried bit lines and insulation layer patterns isolated by a plurality of trenches, wherein the plurality of trenches are formed by etching the first conductive layer and the insulation layer; forming a sacrificial layer to gap-fill the trenches; forming a second conductive layer over the buried bit lines and the sacrificial layer; and forming a plurality of pillars over each of the buried bit lines by etching the second conductive layer.

14 Claims, 11 Drawing Sheets

(56) References Cited

FOREIGN PATENT DOCUMENTS

| KR | 10-2010-0071406 | 6/2010 |
| KR | 10-2011-0047543 | 5/2011 |
| KR | 10-2011-0060747 | 6/2011 |
| KR | 10-2011-0060864 | 6/2011 |
| KR | 10-2011-0133330 | 12/2011 |
| KR | 1020120078917 | 7/2012 |
| KR | 1020120079300 | 7/2012 |

* cited by examiner

SEMICONDUCTOR DEVICE HAVING BURIED BIT LINE AND METHOD FOR FABRICATING THE SAME

CROSS-REFERENCE TO RELATED APPLICATIONS

The present application claims priority of Korean Patent Application No. 10-2011-0143684, filed on Dec. 27, 2011, which is incorporated herein by reference in its entirety.

BACKGROUND

1. Field

Exemplary embodiments of the present invention relate to a semiconductor device, and more particularly, to a semiconductor device having a buried bit line and a method for fabricating the same.

2. Description of the Related Art

As the design rule parameters of semiconductor devices shrink and the cell sizes decrease, difficulties in the manufacturing process significantly increases (for example, in the $8F^2$ or $6F^2$ cell structure, where F is the minimum feature size. Furthermore, a channel margin is degraded by a corresponding reduction in gate length.

In order to address such features, a method for fabricating a semiconductor substrate, where a vertical transistor is formed over the semiconductor substrate has been developed. Exemplary structures formed by such a method include a vertical channel transistor using a pillar as a channel, where the pillar extends in a vertical direction with respect to the surface of the semiconductor substrate. Since the vertical channel transistor occupies a small horizontal area, the cell size may be reduced. Here, since the gate and channel of the vertical channel transistor are formed in a vertical direction, the vertical channel transistor may be implemented in the $4F^2$ cell structure.

When the vertical channel transistor using a pillar is used as a cell transistor of a memory device, one side of a junction becoming a source or drain is connected to a bit line, and the other side of the junction is connected to a capacitor. In general, since the capacitor is disposed over the cell transistor, the capacitor is connected to the top of the pillar, and the bit line is connected to the bottom of the pillar. The bit line is buried in a trench between pillars, and is thus referred to as a buried bit line.

In order to connect the bit line and one side of the junction, a sidewall of the pillar is exposed. This process is referred to as a single-side-contact (SSC) process or one-side contact (OSC) process. Hereafter, the process is referred to as the SSC process. The source formed in the pillar is exposed by the SSC process, and the buried bit line is electrically connected to the exposed source.

Figure 1A:
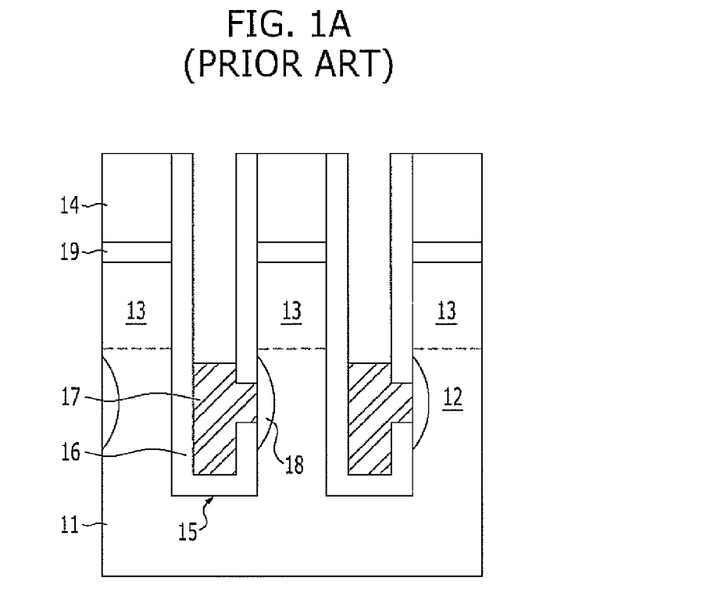
FIG. 1A illustrates a conventional buried bit line.
Figure 1B:
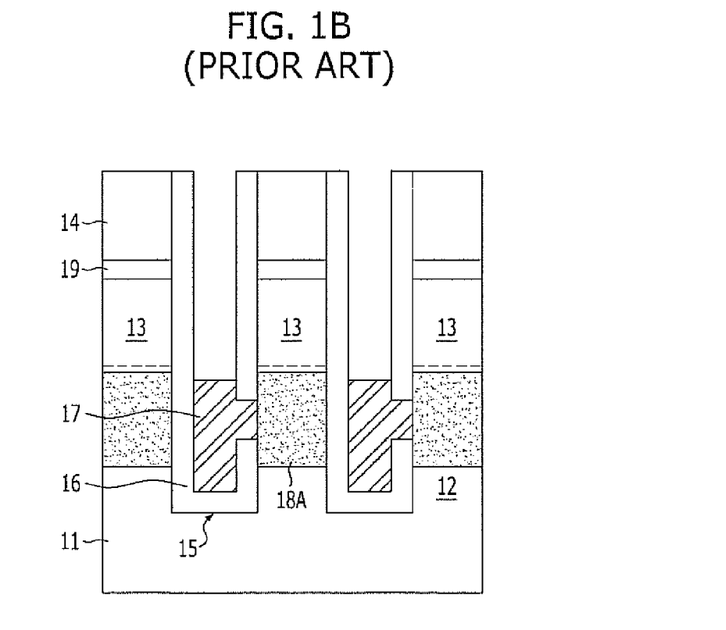
FIG. 1B illustrates features of the conventional buried bit line.

FIG. 1A illustrates a conventional buried bit line. FIG. 1B illustrates features of the conventional buried bit line.

Referring to FIG. 1A, a plurality of pillar structures isolated by trenches 15 are formed in a semiconductor substrate 11. Each of the pillar structures includes a body 12, a pillar 13 formed over the body 12, and a hard mask layer 14 formed over the pillar 13.

An insulation layer 16 is formed on the sidewalls of the pillar structure and the surface of the trench 15. The insulation layer 16 has an opening formed by using the OSC process. The opening opens any one sidewall of the body 12. A buried bit line 17 is formed to partially fill the trench 15. The buried bit line 17 is connected to the body 12 through the opening. The buried bit line 17 is connected to one of two adjacent bodies 12. A first junction 18 is formed in the body 12 so as to be contacted with the buried bit line 17, and a second junction 19 is formed over the pillar 13 so as to contact a capacitor. The first and second junctions 18 and 19 serve as source/drain regions of the vertical channel transistor.

In FIG. 1A, the buried bit line 17 is electrically connected to the first junction 18. In order to form the first junction 18, the trench 15 is gap-filled with doped polysilicon, and annealing is subsequently performed. The first junction 18 is formed before the buried bit line 17 is formed. According to the above description, the conventional semiconductor device has a body-tied structure in which the inside of the body 12 is locally doped to form the first junction 18. In the body-tied structure, the pillar 13 having a channel formed therein is connected to the body 12.

In the body-tied structure, however, since it is difficult to control thermal diffusion of a dopant, a floating-body structure is likely formed. For example, as illustrated in FIG. 1B, when the dopant is excessively diffused, the first junction 18A may be diffused to the other sidewall of the body 12. In this case, the body 12 may float with respect to the channel.

Furthermore, since the OSC process for forming the opening is complex and difficult to perform due to process limits caused by a reduction in critical dimension, mass production becomes difficult.

SUMMARY

An embodiment of the present invention is directed to a semiconductor device having a buried bit line and a vertical channel transistor, capable of isolating a channel and a body, and a method for fabricating the same.

In accordance with an embodiment of the present invention, a semiconductor device includes: a plurality of buried bit lines formed over a semiconductor substrate with an insulation layer interposed therebetween, wherein the plurality of buried bit lines are isolated by a plurality of trenches; a plurality of vertical channel transistors including a plurality of pillars formed vertically over each of the buried bit lines; a plurality of word lines formed on sidewalls of the pillars corresponding to each buried bit lines and extended in a direction crossing the buried bit line; and a plurality of capacitors connected to top surfaces of respective pillars for the buried bit lines.

In accordance with yet another embodiment of the present invention, a method for fabricating a semiconductor device includes: forming an insulation layer over a semiconductor substrate; forming a first conductive layer over the insulation layer; forming a plurality of buried bit lines and insulation layer patterns isolated by a plurality of trenches, wherein the plurality of trenches are formed by etching the first conductive layer and the insulation layer; forming a sacrificial layer to gap-fill the trenches; forming a second conductive layer over the buried bit lines and the sacrificial layer; and forming a plurality of pillars over each of the buried bit lines by etching the second conductive layer.

In accordance with another embodiment of the present invention, a method for fabricating a semiconductor device includes: forming an insulation layer over a semiconductor substrate; forming a metallic layer over the insulation layer; forming a plurality of buried bit lines and insulation layer patterns isolated by a plurality of trenches, wherein the plurality of trenches are formed by etching the metallic layer and the insulation layer; forming a sacrificial silicon layer to gap-fill the trenches; forming a seed layer on the entire surface of the resultant structure including the sacrificial silicon layer; forming an epitaxial silicon layer over the seed layer; and forming a plurality of pillars over each of the buried bit lines by etching the epitaxial silicon layer, the seed layer, and the sacrificial silicon layer, each pillar including the seed layer and an epitaxial silicon layer.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 2A:
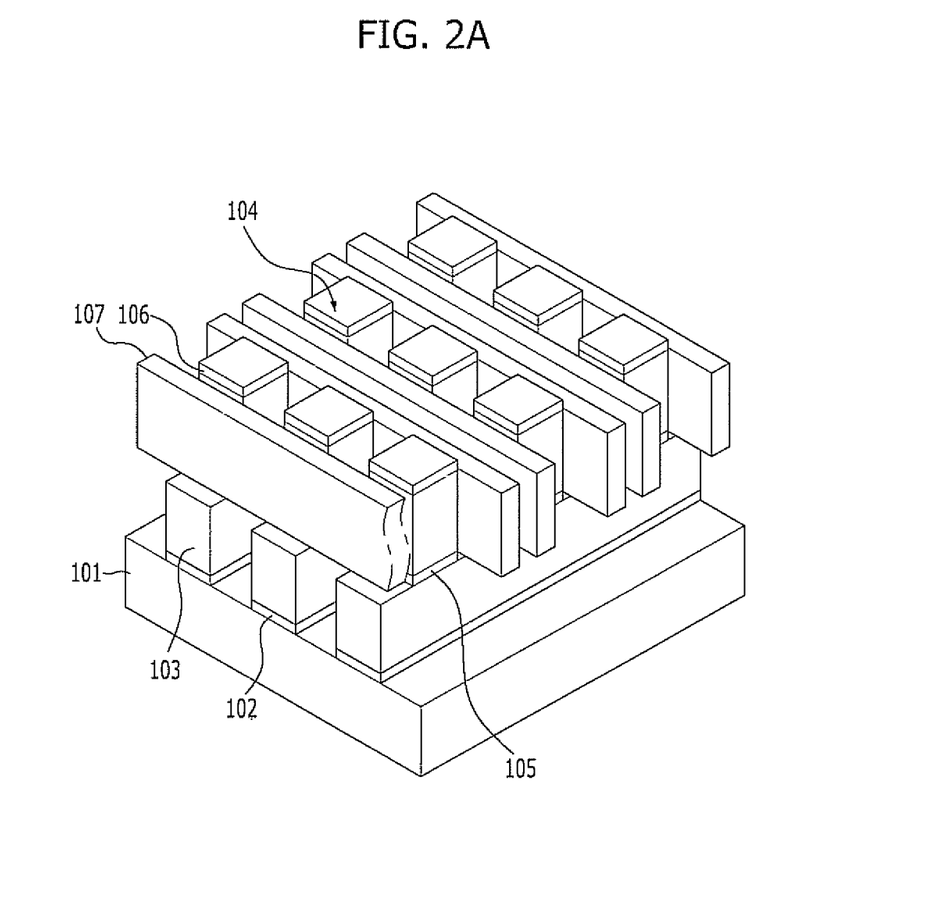
FIGS. 2A and 2B illustrate a semiconductor device having a buried bit line in accordance with embodiments of the present invention.
Figure 2B:
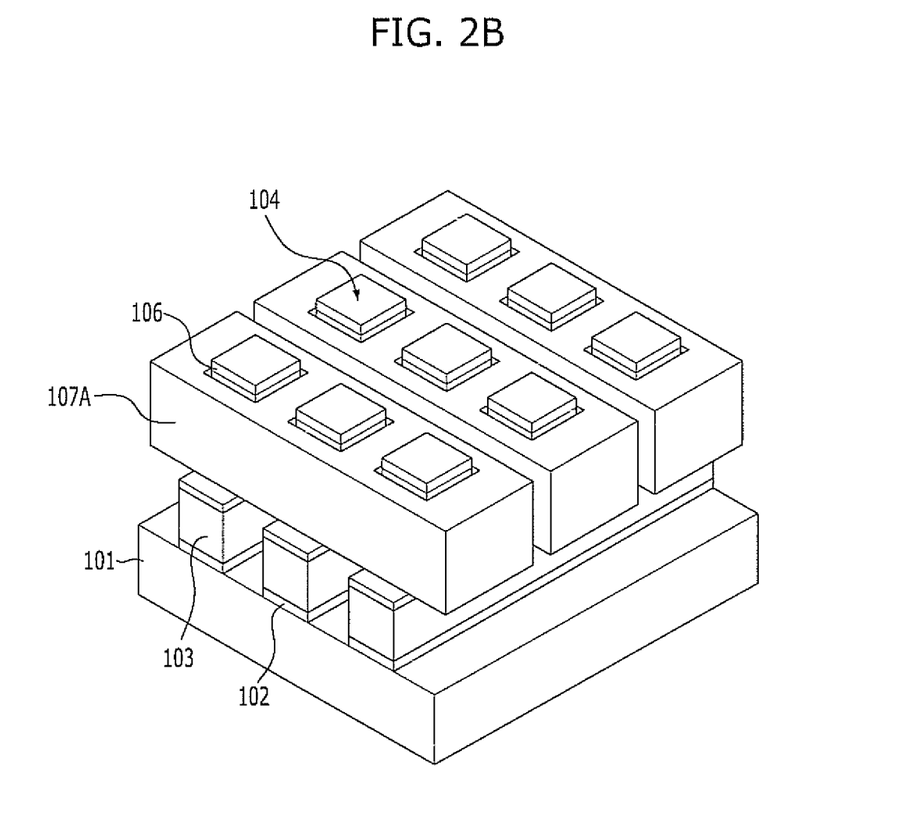

FIGS. 2A and 2B illustrate a semiconductor device having a buried bit line in accordance with embodiments of the present invention.

Referring to FIGS. 2A and 2B, the semiconductor device includes a plurality of buried bit lines 103, a plurality of pillars 104, and a plurality of word lines 107. The plurality of buried bit lines 103 and the plurality of pillars 104 are formed over a semiconductor substrate 101. In the embodiments of the present invention, the pillars 104 may be divided by etching a silicon-containing material. A plurality of pillars 104 are formed over each of the buried bit lines 103. That is, the plurality of pillars 104 are formed over one buried bit line 103. The plurality of buried bit lines 103 are extended in any one direction over the semiconductor substrate 101, and isolated from each other. The buried bit line 103 has a linear shape. The buried bit line 103 may be vertically formed over the semiconductor substrate 101, and the pillar 104 may be vertically formed over the buried bit line 103. For example, the semiconductor 101 may lie at right angles to the buried bit line 103, and the buried bit line 103 may lie at right angles to the pillar 104. The plurality of pillars 104 may be separately formed over the buried bit line 103. The plurality of pillars 104 may have an array arrangement forming a matrix.

The semiconductor substrate 101 includes a silicon-containing material. For example, the semiconductor substrate 101 may include a silicon substrate, a silicon-germanium substrate and a silicon-on-insulator (SOI) substrate. Since the pillar 104 and the semiconductor substrate 101 may include the same material, the pillar 104 includes a silicon-containing material. The pillar 104 includes silicon and silicon germanium.

The pillar 104 may have a structure in which source/drain regions and a channel region of a vertical channel transistor are formed. For example, the pillar 104 may include a first source/drain region 105, a second source/drain region 106, and a vertical channel region. Any one of the first and second source/drain regions 105 and 106 may be connected to the buried bit line 103. The other source/drain region may be connected to a capacitor. The first source/drain region 105, the vertical channel region, and the second source/drain region 106 may be connected in a vertical direction. The first and second source/drain regions 105 and 106 may form an NPN junction or PNP junction with the vertical channel region. For example, when the first and second source/drain regions 105 and 106 are doped with first conductive-type impurities, the vertical channel region may be doped with second conductive-type impurities. Here, when the first conductive-type impurities are N-type impurities, the second conductive-type impurities may include P-type impurities. On the other hand, when the first conductive-type impurities are P-type impurities, the second conductive-type impurities may include N-type impurities. When the vertical channel transistor is an NMOSFET, the first source/drain region 105, the vertical channel region, and the second source/drain region 106 may form an NPN junction.

The buried bit line 103 is formed over the semiconductor substrate 101 with an insulation layer 102 interposed therebetween. In particular, the buried bit line 103 is formed directly under the pillar 104. The buried bit line 103 may be extended in a first direction. The buried bit line 103 may include a material having lower resistance than polysilicon. According to an example, the buried bit line 103 may include a metallic material such as metal, metal nitride or metal silicide. The metal may include tungsten (W), and the metal nitride may include titanium nitride (TiN) and tantalum nitride (TaN). The metal silicide may include tantalum silicide, tungsten silicide, cobalt silicide and the like.

The word line 107 is vertically formed on both sidewalls of the pillar 104. Therefore, the word line 107 may be referred to as 'vertical word line' or 'vertical gate'. Since the word line 107 is formed on both sidewalls of the pillar 104, the semiconductor device may have a double word line structure. Even in the double word line structure, ends of the respective word lines may be connected to each other. Since the pillar 104 is where a channel is to be formed, a vertical channel is formed by the word lines 107. Accordingly, the vertical channel transistor including the first source/drain region 105, the vertical channel formed between the first and second source/drain regions, and the second source/drain region 106 is formed. The word line 107 may extend along a second direction crossing the first direction where the buried bit line extends. The word line 107 may include a metallic material. The word line 107 may include TiN, a stacked layer (WN/W) of tungsten nitride and tungsten and the like. The word line 107 and the buried bit line 103 may be formed to be spaced apart. For example, an insulator may be formed between the word line 107 and the buried bit line 103. Here, the insulator includes silicon oxide or the like.

Referring to FIG. 2B, the word line 107 may extend along the second direction crossing the first direction and surround the pillar 104.

According to the above-described structure, as the buried bit line 103 is formed under the pillar 104, the channel and the semiconductor substrate 101 are electrically isolated from each other and form a floating body. This structure is referred to as a floating body-vertical gate structure.

Furthermore, the buried bit line 103 is formed over the semiconductor substrate 101. Therefore, adjacent buried bit lines 103 are sufficiently spaced from each other, and parasitic capacitance $C_B$ between the adjacent buried bit lines 103 decreases.

FIGS. 3A to 3J illustrate a method for fabricating a buried bit line in accordance with embodiments of the present invention.

Figure 3A:
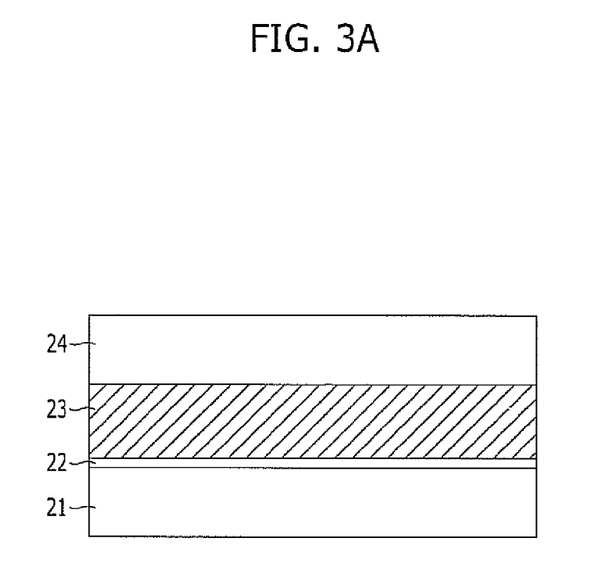
FIGS. 3A to 3J illustrate a method for fabricating a buried bit line in accordance with embodiments of the present invention.

Referring to FIG. 3A, a first insulation layer 22 is formed over the semiconductor substrate 21. The semiconductor substrate 21 includes a silicon-containing material. For example, the semiconductor substrate 21 includes a silicon substrate, a silicon germanium (SiGe) substrate and the like. Before the first insulation layer 22 is formed, native oxide on the semiconductor substrate 21 may be removed. The first insulation layer 22 is a material for preventing a reaction between the semiconductor substrate 21 and a buried bit line to be formed in a subsequent process. The first insulation layer 22 may include oxide. The first insulation layer 22 may be formed using dry oxidation, wet oxidation, radical oxidation, in-situ steam generation (ISSG), plasma oxidation or the like.

The first conductive layer 23 is formed over the first insulation layer 22. The first conductive layer 23 includes a material having a low specific resistance. The first conductive layer 23 is used to form a buried bit line. The first conductive layer 23 may include a metallic material such as metal, metal nitride, or metal silicide. According to an example, the metal may include W, the metal nitride may include TiN and TaN, and the metal silicide may include tantalum silicide, tungsten silicide, cobalt silicide and the like.

A hard mask layer 24 is formed over the first conductive layer 23. The hard mask layer 24 may include nitride. The hard mask layer 24 may have a multilayer structure including oxide and nitride. For example, the hard mask layer 24 may be formed by sequentially stacking nitride and HM oxide. Furthermore, the hard mask layer 24 may be formed by sequentially stacking nitride, oxide, silicon oxynitride (SiON) and carbon.

The hard mask layer 24 may be deposited by a deposition method for applying a low deposition temperature to suppress a reaction with the first conductive layer 23. Exemplary deposition methods include plasma enhanced chemical vapor deposition (PECVD) and atomic layer deposition (ALD).

Figure 3B:
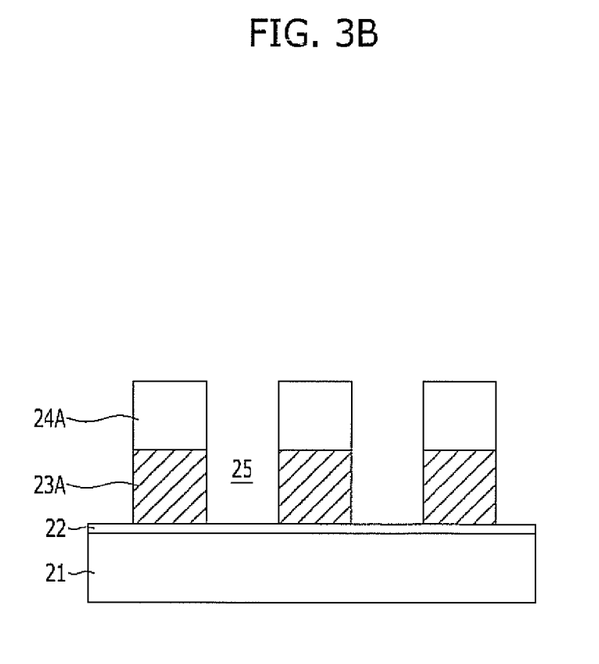

Referring to FIG. 3B, a photoresist pattern (not illustrated) is formed through a photolithography process, and the hard mask layer 24 is etched using the photoresist pattern as an etch mask. Accordingly, a first hard mask layer pattern 24A is formed. The first hard mask layer pattern 24A may include a line pattern extended in any one direction, for example, a first direction. Subsequently, the photoresist pattern is stripped.

The first conductive layer 23 is etched using the first hard mask layer pattern 24A as an etch mask. Accordingly, a buried bit line 23A is formed. The buried bit line 23A is extended in any one direction, for example, the first direction. The buried bit line 23A is extended in the same direction as the first hard mask pattern 24A.

A plurality of buried bit lines 23A are isolated by a plurality of trenches 25, and the semiconductor substrate 21 and the buried bit lines 23A are insulated from each other by the first insulation layer 22.

Figure 3C:
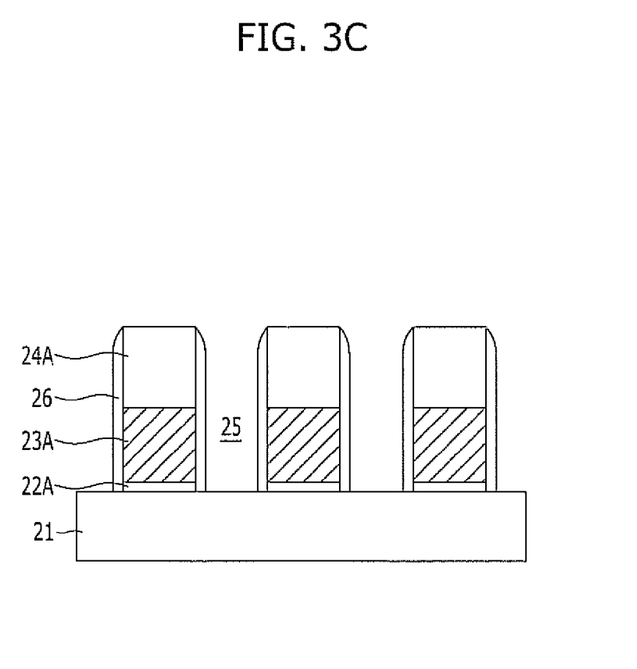

Referring to FIG. 3C, the first insulation layer 22 is etched to form a first insulation layer pattern 22A.

A first spacer 26 is formed on the sidewalls of the buried bit line 23A and the first hard mask layer pattern 24A. The first spacer 26 may include nitride. By forming the first spacer 26 is formed, the sidewalls of the buried bit line 23A may be protected. The first spacer 26 is formed by depositing nitride on the entire surface of the resultant structure and subsequently performing a blanket etch process. The deposition of the nitride used as the first spacer 26 may be performed in single-type equipment using LPCVD in order to minimize a thermal budget applied for the buried bit line 23A.

As the first spacer 26 is formed, a bit line structure is formed over the semiconductor substrate 21. The bit line structure includes the first insulation layer pattern 22A, the buried bit line 23A, the hard mask layer pattern 24A and the first spacer 26. A plurality of bit line structures may be isolated from each other by the trenches 25.

Figure 3D:
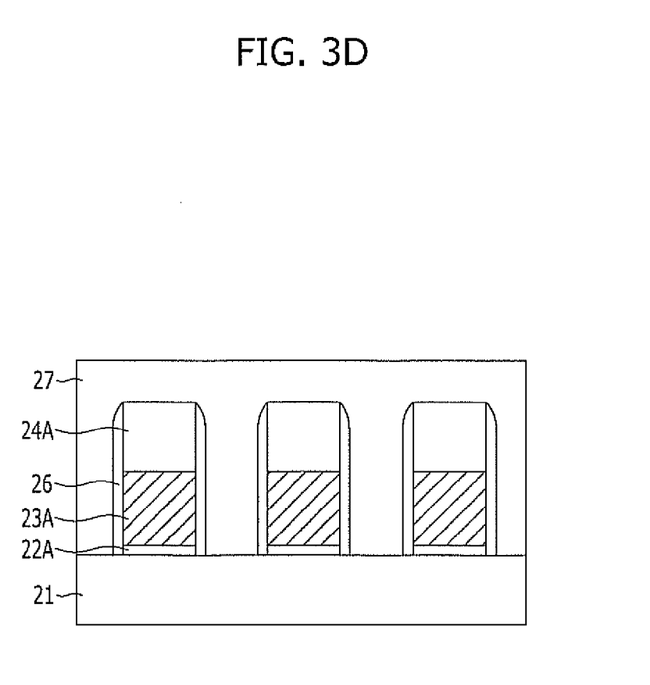

Referring to FIG. 3D, a sacrificial layer 27 is formed over the exposed semiconductor substrate 21 so as to gap-fill the space between the buried bit lines 23A. The sacrificial layer 27 may be formed using epitaxial growth. For example, the sacrificial layer 27 may be formed using selective epitaxial growth (SEG) and may be formed to cover the top of the first hard mask layer pattern 24A. The sacrificial layer 27 includes an epitaxial layer. For example, the sacrificial layer 27 may include epitaxial silicon.

Figure 3E:
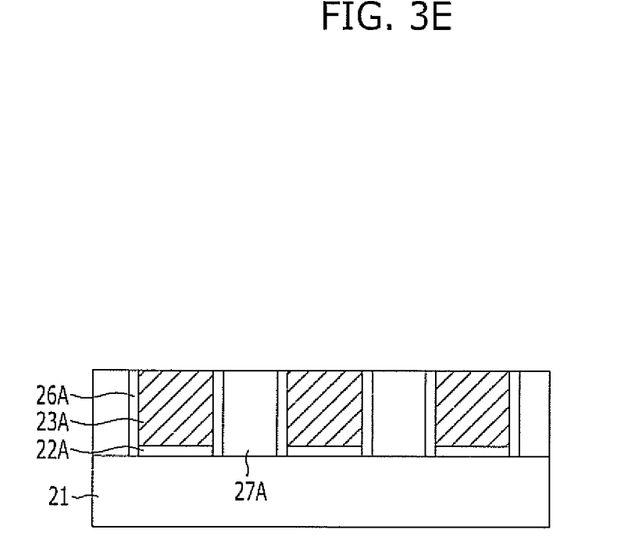

Referring to FIG. 3E, the sacrificial layer 27 is planarized to expose the top surface of the buried bit line 23A. Therefore, a sacrificial layer pattern 27A is formed between the buried bit lines 23A. During the planarization process of the sacrificial layer 27, the first hard mask layer pattern 24A may be removed to expose the top surface of the buried bit line 23A. Here, the spacer is partially removed, and the remaining spacer is represented by reference numeral 26A.

Figure 3F:
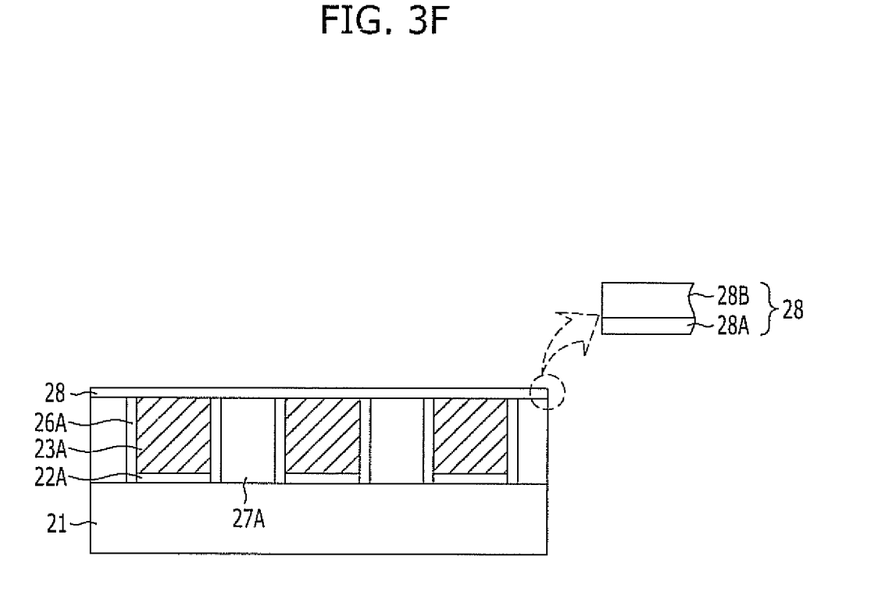
Figure 3G:
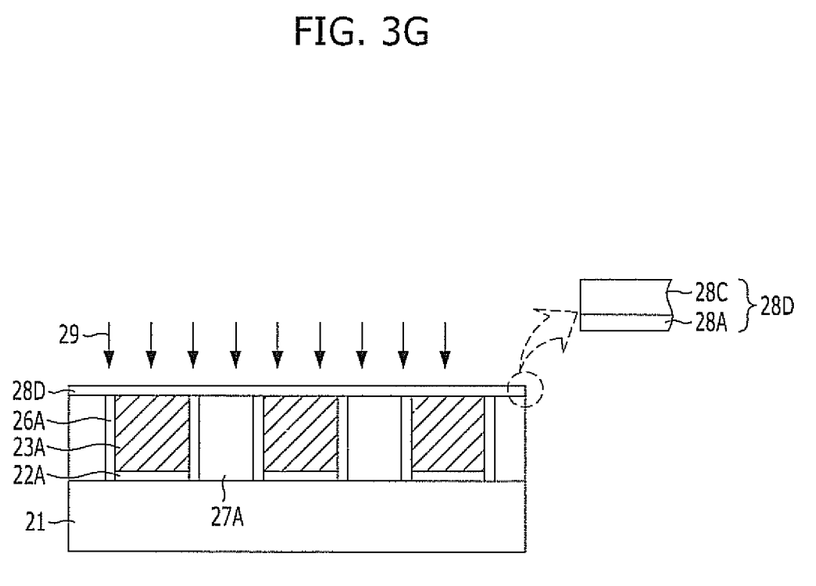

Referring to FIGS. 3F and 3G, a seed layer 28D is formed on the entire surface of the resultant structure including the sacrificial layer pattern 27A. The seed layer 28D may be formed using a solid phase epitaxy (SPE) process. Using the SPE process, an epitaxial layer is grown to a small thickness in an as-deposited amorphous state, and an amorphous layer is grown over the epitaxial layer and subsequently crystallized into an epitaxial layer through a heat treatment 29. The seed layer 28D may include epitaxial silicon.

The SPE process for forming the seed layer 28D will be described as follows.

Referring to FIG. 3F, the semiconductor substrate 21 is loaded into LPCVD equipment for depositing an amorphous silicon layer 28B, and silane ($SiH_4$) is introduced before the deposition step. Accordingly, an epitaxial silicon layer 28A is firstly formed. Hereinafter, the epitaxial silicon layer 28A is referred to as a first epitaxial silicon layer 28A, for convenience of description.

Subsequently, the amorphous silicon layer 28B is deposited. The amorphous silicon layer 28B may be deposited to a thickness of 200 Å or less at a deposition temperature of 530° C. or less. When the first epitaxial silicon layer 28A and the amorphous silicon layer 28B are formed, impurities may be doped in situ. When the first epitaxial silicon layer 28A and the amorphous silicon layer 28B are formed, a doping gas may be introduced. Accordingly, the impurities may be doped in situ into a pre-seed layer 28. Here, the impurities may include phosphorous (Ph) or arsenic (As), and the doping gas may include $PH_3$ or $AsH_3$.

The first reason why the first epitaxial silicon layer 28A is grown in the initial deposition state during the SPE process is that the semiconductor substrate is vacuum-loaded into amorphous silicon deposition equipment immediately after a surface cleaning process is performed. When the surface cleaning process is performed using SPM ($H_2SO_4$:$H_2O_2$=1:20 at 90° C.) and 300:1 BOE (buffered oxide etch), the surface of silicon is hydrogen terminated (that is, silicon dangling bonds are coupled to hydrogen atoms). Subsequently, the growth of native oxide is suppressed for a designated time. Since the growth of the native oxide is suppressed, the first epitaxial silicon layer 28A is grown at the initial stage of the deposition. The second reason why the first epitaxial silicon layer 28A is grown in the initial deposition state during the SPE process is that a gas atmosphere introduced to deposit the amorphous silicon layer 28B includes a hydrogen ($H_2$) gas. That is, when the hydrogen gas is used, a reducing atmosphere is formed during the deposition process. Accordingly, the first epitaxial silicon layer 28A is grown by the reducing atmosphere at the initial stage of the deposition process for the amorphous silicon layer 28B.

As such, the first epitaxial silicon layer 28A and the amorphous silicon layer 28B are formed as the pre-seed layer 28 on the entire surface of the resultant structure including the sacrificial layer pattern 27A.

Referring to FIG. 3G, a heat treatment 29 is performed. As the heat treatment 29 is performed in a nitrogen atmosphere at a temperature of 500 to 700° C., a thermal budget is minimized. Through the heat treatment 29, the amorphous silicon layer 28B is crystallized. Therefore, the amorphous silicon layer 28B becomes the crystallized second epitaxial silicon layer 28C through the heat treatment 29, and the seed layer 28D includes a stacked layer of the first epitaxial silicon layer 28A and the second epitaxial silicon layer 28C.

As described above, the SPE process including the formation of the first epitaxial silicon layer 28A, the formation of the amorphous silicon layer 28B, and the formation of the second epitaxial silicon layer 28C by the heat treatment 29 is performed to form the seed layer 28D. The seed layer 28D consists of epitaxial silicon and a crystallized layer of amorphous silicon (that is, epitaxial silicon). As a result, the seed layer 28D becomes a homogeneous material of epitaxial silicon.

When the SPE process is used, the seed layer 28D may be formed over the buried bit line 23A, which is formed of a metallic material, as well as over the sacrificial layer pattern 27P. According to another example, the seed layer 28D may be formed by SEG. When the SEG is used, it is difficult to grow an epitaxial silicon layer over the buried bit line 23A.

Figure 3H:
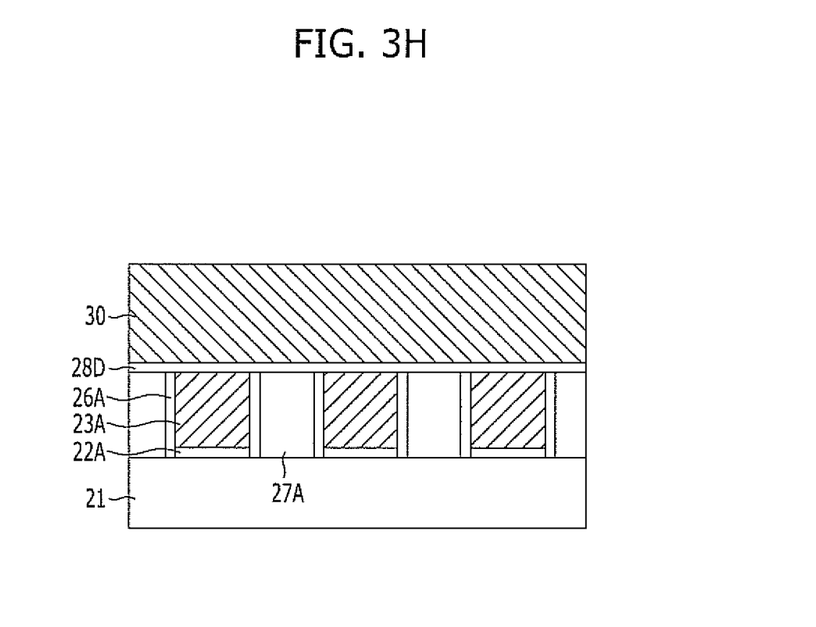

Referring to FIG. 3H, any native oxide on the seed layer 28D is removed through a cleaning process. The cleaning process includes a dry cleaning process or wet cleaning process. The wet cleaning process may include HF-last cleaning where an HF solution is applied, and the dry cleaning process may include plasma cleaning.

A second conductive layer 30 is formed using the seed layer 28D as a seed. The second conductive layer 30 may be formed using epitaxial growth. For example, the second conductive layer 30 may be formed by SEG. Since the seed layer 28D includes an epitaxial silicon layer, the second conductive layer 30 may include an epitaxial silicon layer.

Figure 3I:
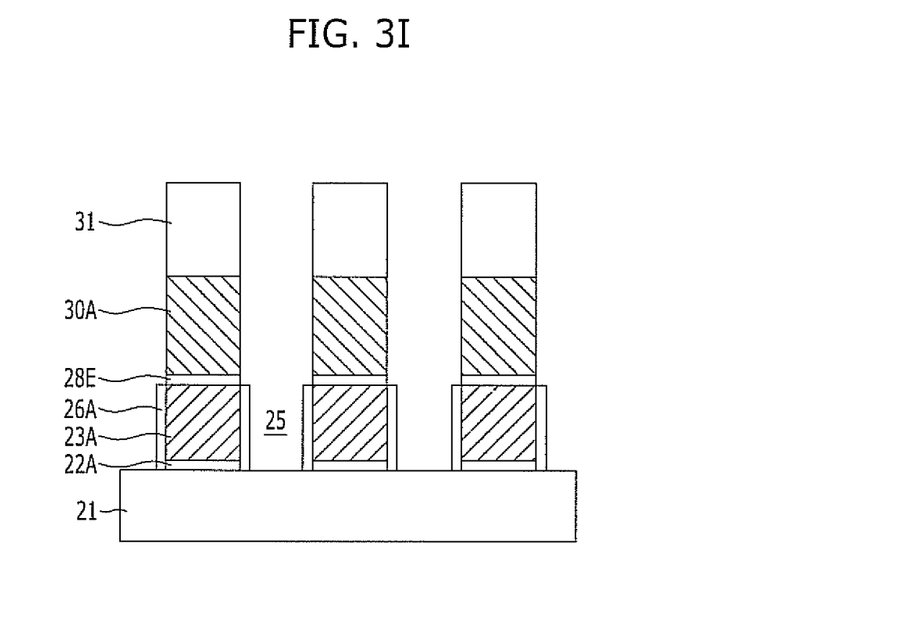

Referring to FIG. 3I, a second hard mask layer pattern 31 is formed over the second conductive layer 30. The second conductive layer 30 and the seed layer 28D are etched using the second hard mask layer pattern 31 as an etch barrier. Accordingly, a plurality of pillars 30A are formed over the buried bit line 23A. The pillars 30A are formed by etching the second conductive layer 30. Under the pillar 30A, the seed layer 28D is etched to form a first/drain region 28E. The seed layer 28D may be used not only as a seed for forming the second conductive layer 30 but also as a source/drain region of the vertical channel transistor because the seed layer 28D is doped with impurities. The first source/drain region 28E may serve as a source/drain region of the vertical channel transistor. That is, since the pillar 30A may be used as a channel of the vertical channel transistor, the first source/drain region 28E may serve as a source/drain region of the vertical channel transistor which is connected to the buried bit line 23A. The pillar 23A is extended in a vertical direction over the buried bit line 23A. The pillar 30A may be formed in each cell unit. A plurality of pillars 30A are formed over each buried bit line 23A. Accordingly, the semiconductor device may have an array arrangement forming a matrix.

Subsequently, the sacrificial layer pattern 27A is removed. Therefore, all of the sacrificial layer patterns 27A between the buried bit lines 23A are removed to open the trenches 25. When the sacrificial layer patterns 27A are removed, the buried bit line 23A and the spacer 26A are not removed due to their etching selectivity with respect to the sacrificial layer patterns 27A.

Figure 3J:
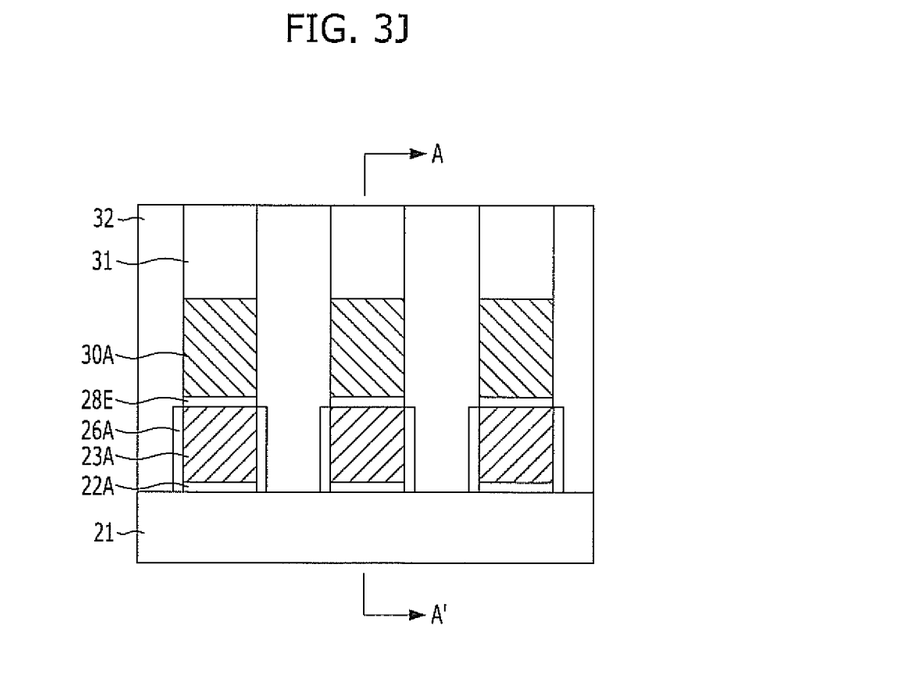

Referring to FIG. 3J, an interlayer dielectric layer 32 is formed to gap-fill the spaces between the pillars 30A and the buried bit lines 23A.

FIGS. 4A to 4E are diagrams illustrating a method for fabricating a memory cell, taken along a line A-A' of FIG. 3J.

Figure 4A:
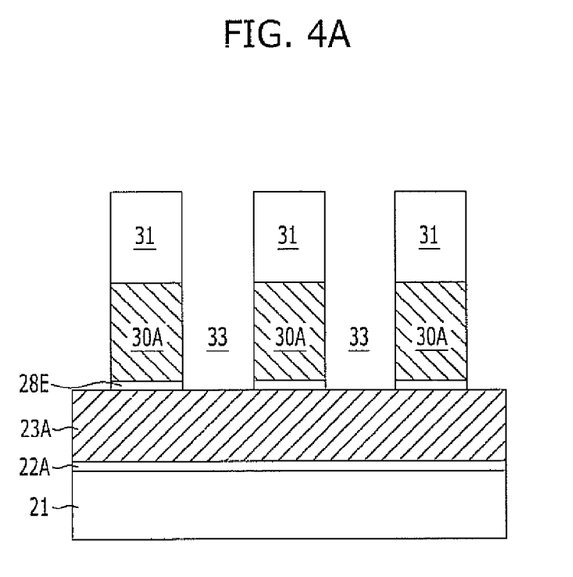
FIGS. 4A to 4E are diagrams illustrating a method for fabricating a memory cell, taken along a line A-A' of FIG. 3J.

Referring to FIG. 4A, the interlayer dielectric layer 32 is etched to form a word line trench 33. Since the pillar 30A is patterned in each cell unit, only the interlayer dielectric layer 32, for example, is etched. The word line trench 33 is a line-type pattern.

A photoresist pattern (not illustrated) is used to form the word line trench 33. Using the photoresist pattern as an etch barrier, the interlayer dielectric layer 32 between the pillars 30A is etched in a direction crossing the buried bit line 23A.

Figure 4B:
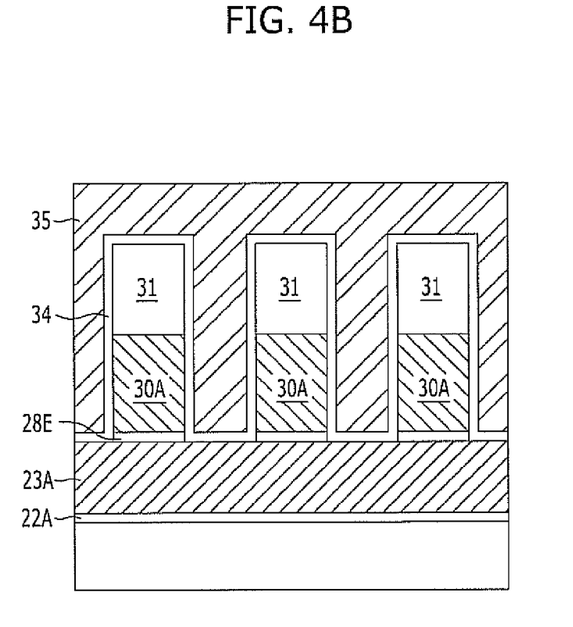

Referring to FIG. 4B, a word line conductive layer 35 is formed to gap-fill the word line trench 33. Before the word line conductive layer 35 is formed, the gate dielectric layer 34 may be formed. The gate dielectric layer 34 may be formed by oxidizing the sidewalls of the pillar 30A, where the gate dielectric layer 34 may be deposited on the entire surface of the resultant structure to insulate the buried bit line 23A from a word line. According to an example, the gate dielectric layer 34 may include silicon oxide deposited on the entire surface. The word line conductive layer 35 includes a low-resistance material. For example, a metallic material may be used. The metallic material may include Ti, TiN and W.

Figure 4C:
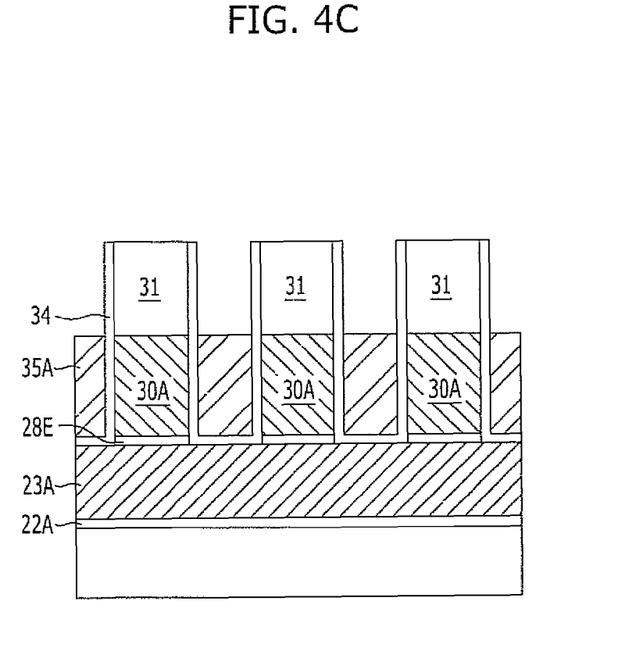

Referring to FIG. 4C, planarization and etch-back processes are sequentially performed on the word line conductive layer 35, thereby leaving the recessed word line conductive layer 35A. The planarization process includes a chemical mechanical polishing (CMP) process, and the CMP process may use the second hard mask layer pattern 31 as a polishing stop layer. Therefore, the gate dielectric layer 34 over the second hard mask layer pattern 31 may be removed.

Figure 4D:
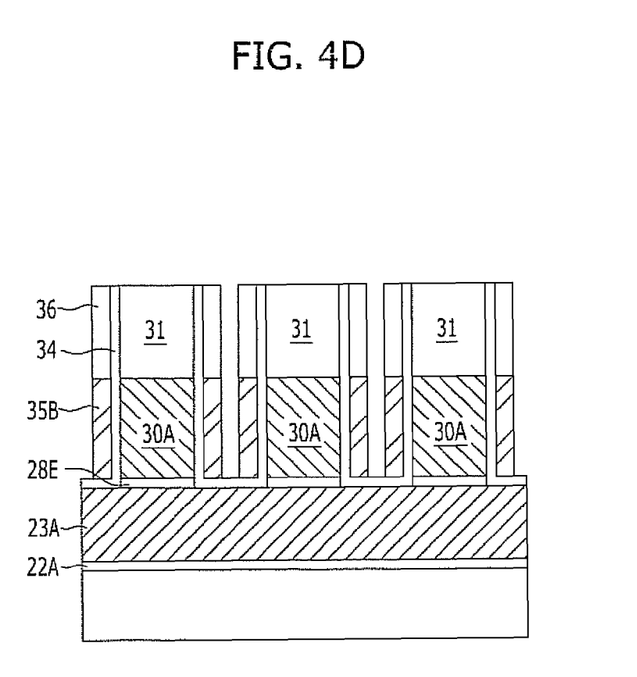

Referring to FIG. 4D, an insulation layer is deposited, and an etch-back process is subsequently performed to form a second spacer 36. The second spacer 36 may include nitride.

Using the second spacer 36 as an etch barrier, the word line conductive layer 35A is etched. Accordingly, a vertical word line 35B is formed on both sidewalls of the pillar 30A. The vertical word line 35B may serve as a vertical gate electrode. In another embodiment, the vertical word line 35B may be formed to surround the pillar 30A. In another embodiment, after a ring-shaped vertical gate electrode is formed to surround the pillar 30A, a vertical word line 35B may be formed to connect adjacent gate electrodes. The vertical word line 35B is formed in a direction crossing the buried bit line 23A. The vertical word line 35B and the buried bit line 23A may be insulated from each other by the gate dielectric layer 34.

Figure 4E:
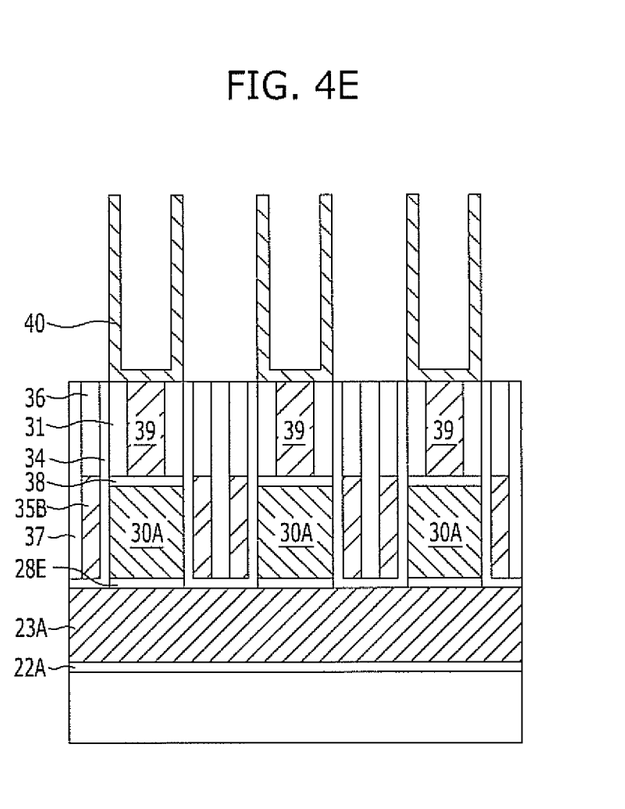

Referring to FIG. 4E, a word line isolation layer 37 is formed to insulate the vertical word lines 35B. The word line isolation layer 37 includes an insulation layer such as an oxide layer. The word line isolation layer 37 may be formed by firstly forming an insulation layer on the entire structure having the vertical word line 35B formed therein and subsequently planarizing the structure.

A storage node contact etch process is performed to expose the top surface of the pillar 30A. Subsequently, a storage node contact plug 39 is formed. Before the storage node contact plug 39 is formed, ion implantation may be performed to form a second source/drain region 38. The second source/drain region 38 may be performed by a general ion implantation method. Therefore, the pillar 30A may include the second source/drain region 38 and the vertical channel region. The vertical channel region is formed between the first source/drain region 28E and the second source/drain region 38. The second source/drain region 38 may be connected to a capacitor. The first source/drain region 28E, the vertical channel region, and the second source/drain region 38 may be connected in a vertical direction. The first and second source/drain regions 28E and 38 may form an NPN junction or PNP junction with the vertical channel region. For example, when the first and second source/drain regions 28E and 38 are doped with first conductive-type impurities, the vertical channel region may be doped with second conductive-type impurities. Here, when the first conductive-type impurities are N-type impurities, the second conductive-type impurities include P-type impurities. On the other hand, when the first conductive-type impurities are P-type impurities, the second conductive-type impurities include N-type impurities. When the vertical channel transistor is an NMOSFET, the first source/drain region 28E, the vertical channel region, and the second source/drain region 38 may form an NPN junction.

A capacitor is formed over the storage node contact plug 39. The capacitor includes a storage node 40. The storage node 40 may be formed in a cylindrical shape. In another embodiment, the storage node 40 may be formed in a pillar shape or concave shape. Although not illustrated, a dielectric layer and a top electrode are subsequently formed.

In accordance with the embodiments of the present invention, drain induced barrier lowering, (DIBL) which occurs as the channel length is reduced by using the vertical gate structure, may be improved. Furthermore, since the cell efficiency is reduced by the $4F^2$ structure, the net die may be increased.

Furthermore, in the floating body-vertical gate structure, the buried bit line is formed under the pillar, thereby electrically isolating the channel from the body. Therefore, a floating body may be obtained. Since the pillar is formed over the buried bit line after the buried bit line is formed, the level of difficulty in the OSC process may be improved, and the CD reduction may be achieved.

The semiconductor device in accordance with the embodiment of the present invention may include a memory cell and a memory cell array. A bit line and a word line may store and output data based on voltages applied by a column decoder and a row decoder which are connected to the memory cell array.

The memory cell array in accordance with the embodiment of the present invention may be used in a memory device. An exemplary memory device may include a memory cell array, a row decoder, a column decoder, a sense amplifier and the like. The row decoder selects a word line corresponding to a memory cell to perform a read or write operation, among word lines of the memory cell array, and outputs a word line select signal to the memory cell array. Furthermore, the column decoder selects a bit line corresponding to a memory cell to perform a read or write operation, among bit lines of the memory cell array, and outputs a bit line select signal to the memory cell array. Furthermore, the sense amplifier senses the data stored in the memory cell selected by the row decoder and the column decoder.

The memory device in accordance with the embodiment of the present invention may be applied to DRAM (dynamic random access memory). Without being limited thereto, the memory device may be applied to SRAM (static random access memory), Flash Memory, FeRAM (ferroelectric random access memory), MRAM (magnetic random access memory), PRAM (phase change random access memory) and the like.

The above-described memory device may be applied to not only a computing memory used for desktop computers, notebook computers, and servers, but also a graphics memory having various specifications and a mobile memory. Furthermore, the above-described memory device may be applied to not only portable storage mediums such as memory stick, MMC, SD, CF, xD picture card, and USB flash device, but also various digital applications such as MP3P, PMP, digital camera, camcorder, and mobile phone. Furthermore, a single product of the memory device may be applied to MCP (multi-chip package), DOC (disk on chip), an embedded device and the like. Furthermore, the memory device may be applied to CIS (CMOS image sensor) and provided to various fields such as camera phone, web camera, and medical small-sized imaging device.

The memory device in accordance with the embodiment of the present invention may be used in a memory module. The memory module includes a plurality of memory devices mounted on a module substrate, a command link through which the memory device receives a control signal (address signal, command signal, or clock signal) from an external controller, and a data link connected to the memory device to transmit data. Here, the command link and the data link may be formed in the same manner as or a similar manner to those used in a typical memory module. An exemplary memory module may include eight memory devices mounted on the front surface of the module substrate. Furthermore, memory devices may also be mounted on the rear surface of the module substrate. That is, memory devices may be mounted on one side or both sides of the module substrate, and the number of mounted memory devices is not limited. Furthermore, the material and structure of the module substrate are not limited.

The memory module in accordance with the embodiment of the present invention may be used in a memory system.

The memory system includes one or more memory modules each having a plurality of memory devices mounted thereon and a controller configured to provide a bidirectional interface between the memory modules and an external system and control the operations of the memory modules.

The memory system in accordance with the embodiment of the present invention may be used in an electronic unit. The electronic unit includes a memory system and a processor electrically connected to the memory system. Here, the processor includes a CPU (central processing unit), an MPU (micro processor unit), an MCU (micro controller unit), a GPU (graphics processing unit) and a DSP (digital signal processor). Here, the CPU or MPU is configured by combining an ALU (arithmetic logic unit) and a CU (control unit) configured to control each unit by reading and analyzing a command. When the processor is a CPU or MPU, the electronic unit may include a computer device or mobile device. Furthermore, the GPU serving as a CPU for graphic is used for calculating numbers with a decimal point and serves to draw graphics in real time. When the process is a GPU, the electronic unit may include a graph device. Furthermore, the DSP refers to a processor which converts an analog signal (for example, voice) into a digital signal at high speed, or reconverts a digital signal into an analog signal, thereby using the result. The DSP is used to calculate a digital value. When the processor is a DSP, the electronic unit may include a sound and video device. In addition, the processor includes an APU (accelerate processor unit). The APU is configured by integrating CPU into GPU, and includes the role of a graphic card.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
    forming an insulation layer over a semiconductor substrate;
    forming a metallic layer over the insulation layer;
    forming a plurality of buried metal bit lines and insulation layer patterns isolated by a plurality of trenches, wherein the plurality of trenches are formed by etching the metallic layer and the insulation layer;
    forming a sacrificial layer by using selective epitaxial growth (SEG) to gap-fill the trenches;
    forming a seed layer doped with impurities on the entire surface of a structure including the sacrificial layer by using solid phase epitaxy (SPE) after forming the sacrificial layer;
    forming a conductive layer over the seed layer;
    forming a plurality of pillars over each of the buried metal bit lines by etching the conductive layer; and
    forming a plurality of source/drain over each of the buried metal bit lines by etching the seed layer,
    wherein the seed layer is in direct contact with the plurality of buried metal bit lines and the sacrificial layer,
    wherein the impurities are doped in situ.

2. The method of claim 1, wherein further comprising forming a spacer on sidewalls of the buried metal bit lines after the forming of the plurality of the buried metal bit lines.

3. The method of claim 1, wherein the sacrificial layer and the conductive layer each comprise epitaxial silicon.

4. The method of claim 1, wherein the conductive layer is formed using selective epitaxial growth (SEG).

5. The method of claim 1, wherein the forming of the seed layer comprises:
    depositing an amorphous layer on the entire surface of the structure including the sacrificial layer by using solid phase epitaxy (SPE); and
    crystallizing the amorphous layer into an epitaxial layer.

6. The method of claim 5, wherein the crystallizing of the amorphous layer into the epitaxial layer comprises an annealing process.

7. The method of claim 1, further comprising, after the forming of the plurality of pillars:
    forming a vertical word line adjacent to sidewalls of the pillar; and
    forming a capacitor connected to the top of the pillar.

8. A method for fabricating a semiconductor device, comprising:
    forming an insulation layer over a semiconductor substrate;
    forming a metallic layer over the insulation layer;
    forming a plurality of buried metal bit lines and insulation layer patterns isolated by a plurality of trenches, wherein the plurality of trenches are formed by etching the metallic layer and the insulation layer;
    forming a sacrificial silicon layer by using selective epitaxial growth (SEG) to gap-fill the trenches;
    forming a seed layer doped with impurities on the entire surface of a structure including the sacrificial silicon layer by using solid phase epitaxy (SPE) after forming the sacrificial layer;
    forming an epitaxial silicon layer over the seed layer; and
    forming a plurality of pillars over each of the buried metal bit lines by etching the epitaxial silicon layer, the seed layer, and the sacrificial silicon layer, wherein each of the pillars comprises the seed layer and the epitaxial silicon layer,
    wherein the seed layer is in direct contact with the plurality of buried metal bit lines and the sacrificial layer,
    wherein the impurities are doped in situ.

9. The method of claim 8, wherein the epitaxial silicon layer is formed using selective epitaxial growth (SEG).

10. The method of claim 8, wherein the forming of the seed layer comprises:
    depositing an amorphous silicon layer on the entire surface of the structure including the sacrificial silicon layer; and
    crystallizing the amorphous silicon layer into an epitaxial silicon layer.

11. The method of claim 10, further comprising forming an epitaxial silicon layer by introducing silane ($SiH_4$) gas in a deposition chamber of the amorphous silicon layer before depositing of the amorphous silicon layer.

12. The method of claim 10, wherein the crystallizing of the amorphous silicon layer into the epitaxial silicon layer comprises an annealing process.

13. The method of claim 8, further comprising a spacer on the sidewalls of the buried metal bit lines after the forming of the plurality of buried metal bit lines.

14. The method of claim 8, further comprising, after the forming of the plurality of pillars:
    forming a vertical word line adjacent to the sidewalls of each pillar; and
    forming a capacitor connected to the top of the pillar.

* * * * *